United States Patent
Fang et al.

(10) Patent No.: US 6,195,396 B1
(45) Date of Patent: Feb. 27, 2001

(54) ENCODING/DECODING SYSTEM USING 16-QAM MODULATION ENCODED IN MULTI-LEVEL BLOCKS

(75) Inventors: Juing Fang, Cergy Pontoise; Pierre Roux, Argenteuil; Jean-François Houplain, St Germain en Laye, all of (FR)

(73) Assignee: Alcatel Telspace, Nanterre Cedex (FR)

(*) Notice: Subject to any disclaimer, the term of this patent is extended or adjusted under 35 U.S.C. 154(b) by 0 days.

(21) Appl. No.: 08/768,399

(22) Filed: Dec. 18, 1996

(30) Foreign Application Priority Data

Dec. 19, 1995 (FR) .................................. 95 15053

(51) Int. Cl.⁷ ...................................... H04L 7/02
(52) U.S. Cl. .................. 375/261; 329/304; 332/103; 375/298
(58) Field of Search ..................... 375/260, 261, 375/262, 264, 275, 281, 283, 286, 292, 295, 298, 316, 340, 341, 279; 332/103; 329/304

(56) References Cited

U.S. PATENT DOCUMENTS

| 4,660,214 | * | 4/1987 | Pahlavan | 375/262 |
| 5,230,077 | * | 7/1993 | Raith | 455/65 |
| 5,502,744 | * | 3/1996 | Marshall | 375/259 |

FOREIGN PATENT DOCUMENTS

| 0052463A1 | 5/1982 | (EP) . |
| 0392538A2 | 10/1990 | (EP) . |
| 0610648A3 | 8/1994 | (EP) . |
| 0616454A1 | 9/1994 | (EP) . |
| 0624019A2 | 11/1994 | (EP) . |
| WO92/20162 | 11/1992 | (WO) . |
| WO93/06550 | 4/1993 | (WO) . |

OTHER PUBLICATIONS

R. A. Wagner et al, "The string–to–string correctin problem", *Journal of The Association for Computing Machinery*, Jan. 1974, USA, vol. 21, No. 1, ISSN 0004–5411, pp. 168–173.

* cited by examiner

Primary Examiner—Fan Tsang
Assistant Examiner—Congvan Tran
(74) Attorney, Agent, or Firm—Sughrue, Mion, Zinn, Macpeak & Seas, PLLC

(57) ABSTRACT

The invention provides a block-encoded modulation scheme using multi-level partitioning techniques. This scheme is made transparent to phase ambiguities of $\pm\pi/2$ and of $\pi$, by means of differential encoding and appropriate mapping, it is applicable to 16-QAM modulation, and it has theoretical encoding gain that is optimal for the rate of the code. The decoder associated with this scheme uses the Wagner algorithm which is much less complicated to implement than the Viterbi algorithm or than the Reed-Solomon algorithm.

2 Claims, 3 Drawing Sheets

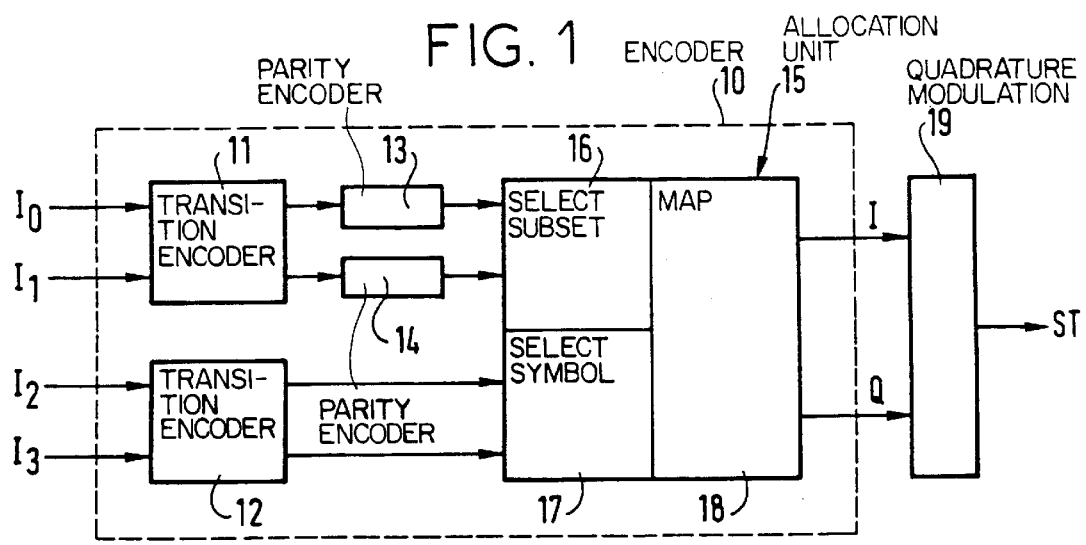
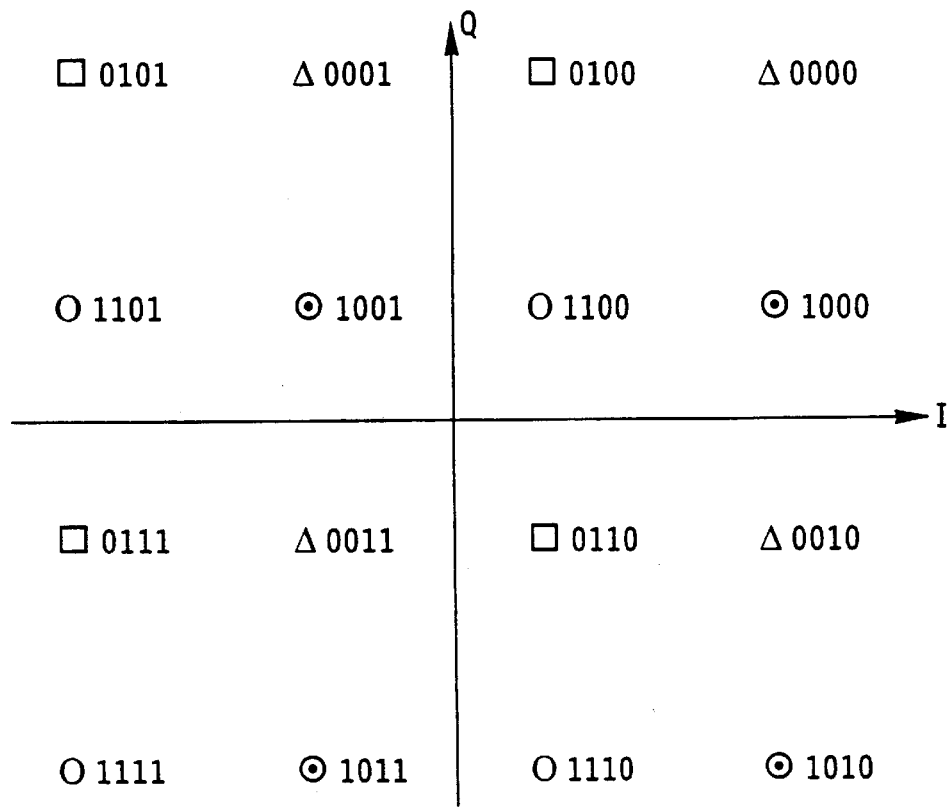

ENCODING/DECODING SYSTEM USING 16-QAM MODULATION ENCODED IN MULTI-LEVEL BLOCKS

The invention relates to encoding and decoding digital signals, and it relates more precisely to an encoding/decoding system using 16-QAM modulation encoded in multi-level blocks, which system is transparent to phase shifts of $\pm\pi/2$ and of $\pi$, has a high coding rate, and is simple to implement.

BACKGROUND OF THE INVENTION 16-state quadrature amplitude modulation (16-QAM) is widely used in the field of radio communications because of its high spectral effectiveness (compared with the commonly used techniques of phase modulation and of frequency modulation), and because it is relatively simple to implement (implementing the modulator/demodulator, processing the signal, etc.).

Furthermore, in the context of radio transmission, the cost of leasing transmission channels is directly related to the transmitted spectrum width. That is why the channel encoding technique chosen for this type of link must have a high rate.

Finally, error-correcting encoding must not only have performance levels that are acceptable from the system point of view, but must also be as simple as possible to implement, in particular as regards the decoder.

In the context of the present invention, the data transmitted from a transmitter to a receiver is integrated into a framed structure having fixed redundancy. In which case, block coded modulation is preferable to trellis coded modulation (TCM).

It is known that, for such transmission, it is possible to use modulation and high-rate convolutional encoding that are separated from each other. In the case of a framed structure having a fixed rate (N redundancy bits being added to every K message information bits to be transmitted), 16-QAM modulation associated with a block code like the Reed-Solomon code with firm decision is a natural choice.

Unfortunately, the choice of convolutional encoding either separate from or associated with modulation (TCM encoding) implies a rate that is necessarily limited. In addition, such a choice is not compatible with the choice of a framed structure having a fixed rate. Furthermore, the corresponding decoder associated with a convolutional code (Viterbi algorithm) is relatively complex.

For modulation associating 16-QAM mapping with Reed-Solomon coding, it is necessary to use a complex decoder. Furthermore, that solution does not enable decoding to take place under flexible-decision conditions.

Moreover, when coherent demodulation is performed by a carrier-recovery system enabling the phase and the frequency of the signal to be synchronized on reception, there still remain phase ambiguities that must be removed after such synchronization. For example, all QPSK and n-QAM constellations (two-dimensional constellations) have three phase ambiguities ($+\pi/2$, $-\pi/2$, and $\pi$) which must be removed. The encoding scheme is said to be "transparent to phase ambiguities" if it enables the sequence to be retrieved on reception as transmitted regardless of the phase ambiguity imparted on reception by carrier-recovery.

OBJECTS AND SUMMARY OF THE INVENTION

The present invention proposes a block-encoded modulation scheme using multi-level partitioning techniques of the multi-level coding (MLC) type. This scheme is made transparent to phase ambiguities of $\pm\pi/2$ and of $\pi$ by means of differential encoding and appropriate mapping, it is applicable to 16-QAM modulation, and it has theoretical encoding gain that is optimal for the rate of the code. The encoding is of the systematic type (the message information bits to be transmitted are not modified, only parity information is added), and the decoder associated with this scheme uses the Wagner algorithm which is much less complicated to implement than the Viterbi algorithm or than the Reed-Solomon algorithm, and it operates under flexible-decision conditions.

More precisely, the present invention provides an encoding/decoding system using 16-QAM modulation encoded in multi-level blocks, said system including a transmitter for transmitting message information bits and a receiver for receiving message information bits;

said transmitter including:
  two transition encoders, each of which has two dimensions, a first of said encoders receiving two message information bits to be transmitted referred to as more significant bits, the second of said encoders receiving two other message information bits to be transmitted referred to as less significant bits;
  two parity encoders having a coding rate N/N–1, where N is even, receiving the bits output from said first transition encoder, said parity encoders supplying, every N symbols, said bits output from said first transition encoder together with parity information;
  an allocation unit for allocating a symbol from the complex plane of the 16-QAM constellation to each group of four bits output by said parity encoders and by said second transition encoders, said allocation unit supplying the respective amplitude levels of said symbols on respective transmission paths, while satisfying the following rules:
    all of the symbols in the same quadrant of said complex plane have the same two less significant bits; and
    the two more significant bits of the symbols in the same quadrant and close to the same axis of said complex plane differ from symbol to symbol by a single bit, the symbols in said complex plane being split up into subsets, each subset having a pair of more significant bits that is different from the pair of more significant bits of another subset; and
  quadrature modulation means for modulating said amplitude levels in quadrature, and supplying a signal to be transmitted; and said receiver including:
  quadrature demodulation means for demodulating the received signal in quadrature, and supplying two received amplitude levels;
  a pre-decision unit which takes a firm decision on the received amplitude levels, and which, for each of said received amplitude levels, firstly calculates a reliability coefficient equal to the difference in absolute terms between the squared Euclidean distances of each received amplitude level and the amplitude level corresponding to the closest ideal symbol in the 16-QAM constellation, and secondly supplies sector information making it possible to define which one of the three sectors delimited by decision thresholds corresponding to expected ideal amplitude levels for the four symbols closest to the two axes of said 16-QAM constellation is the sector in which the received symbol lies;

two Wagner decoders taking flexible decisions, each of which decoders receiving firstly the firm decisions corresponding to said more significant bits and secondly one of said reliability coefficients, said Wagner decoders supplying, every N information symbols, said firm decisions together with correction information indicating that said parity information checks;

a decision unit receiving said firm decisions, said correction information and said sector information, said decision unit correcting the two more significant bits output by said Wagner decoders as a function of said correction information, and correcting the two decided less significant bits as a function of said sector information, of the corrected more significant bits, and of said correction information; and two transition decoders, each of which has two dimensions, a first one of said decoders receiving the two corrected more significant bits, the second one of said decoders receiving the two corrected less significant bits, said decoders supplying received and decoded bits.

For example, N may be equal to 16.

BRIEF DESCRIPTION OF THE DRAWINGS

Other characteristics and advantages of the invention appear on reading the following description of a preferred embodiment given by way of non-limiting example and with reference to the accompanying drawings, in which:

FIG. 1 is a block diagram of a signal transmitter including encoding means of the invention;

FIG. 2 shows an example of a 16-QAM constellation adapted to the encoding/decoding system of the invention;

MORE DETAILED DESCRIPTION

Figure 3:
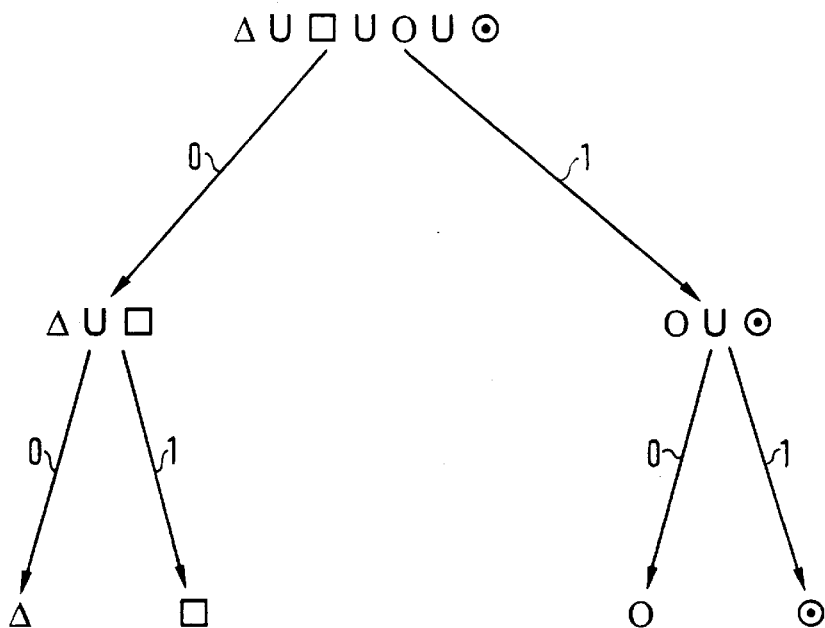
FIG. 3 shows the partitioning into subsets that is chosen to obtain the constellation shown in FIG. 2.

FIG. 1 is a block diagram of a signal transmitter including encoding means of the invention.

The transmitter of the system of the invention for encoding and decoding digital data includes encoding means given overall reference 10. The encoding means 10 receive input message information bits to be transmitted $I_0$ to $I_3$, and, on two transmission channels I and Q, they supply amplitude levels to be transmitted.

The encoding means 10 include two transition encoders 11, 12 (differential encoders), each of which has two dimensions, a first one of the encoders (11) receiving bits $I_0$ and $I_1$ and the second one of the encoders (12) receiving bits $I_2$ and $I_3$.

In the remainder of the description, bits $I_0$ and $I_1$ are referred to as "more significant bits", and bits $I_2$ and $I_3$ are referred to as "less significant bits".

By way of example, the equations of each of the two-dimensional differential encoders used are as follows:

$$a_i = (\overline{A_i} \cdot \overline{B_i} \cdot a_{i-1}) + (A_i \cdot \overline{B_i} \cdot \overline{b_{i-1}}) + (A_i \cdot \overline{B_i} \cdot \overline{a_{i-1}}) + (\overline{A_i} \cdot B_i \cdot b_{i-1})$$

$$b_i = (\overline{A_i} \cdot \overline{B_i} \cdot b_{i-1}) + (A_i \cdot \overline{B_i} \cdot a_{i-1}) + (A_i \cdot B_i \cdot \overline{b_{i-1}}) + (\overline{A_i} \cdot B_i \cdot \overline{a_{i-1}})$$

where A and B are the bits applied to the input of the differential encoder, a and b are the bits output by the differential encoder, $\overline{X}$ is the complement of X, $X_i$ is the bit in question at instant t, and $X_{i-1}$ is the bit in question at instant t−1.

The differentially encoded bits output by the encoder 11 are applied to two parity encoders 13, 14 of rate N−1/N, where N is even. Each of the parity encoders 13, 14 performs modulo 2 summing on N−1 bits to calculate parity information. The parity information constitutes the redundancy added on transmission. By way of example, N is equal to 16, and each encoder 13, 14 sums 15 successive bits to calculate a sixteenth bit equal to the sum modulo 2 of the 15 preceding bits. N encoded bits are thus available at the output of each of the encoders 13 and 14.

Similarly, N bits are available at the output of the differential encoder 12.

The groups of encoded quadruplets are applied to an allocation unit 15 which allocates a symbol from the complex plane of the 16-QAM constellation to each group of four encoded bits. On the respective transmission channels I and Q, the allocation unit 15 supplies the respective amplitude levels of symbols to be transmitted, while complying with the following rules:

all the symbols in the same quadrant of the complex plane have the same two less significant bits; and the more significant bits of the symbols in the same quadrant and close to the same axis of the complex plane differ from symbol to symbol by a single bit, the symbols in the complex plane being split up into subsets, and each subset having a different pair of more significant bits.

These two rules correspond to Gray mapping.

FIG. 2 shows an example of a 16-QAM constellation adapted to the encoding/decoding system of the invention. To facilitate understanding, the various symbols to be transmitted are represented by the symbols Δ, o, Π, and Θ, four bits being allocated to each of these symbols.

It can be observed that all of the symbols in the same quadrant of the complex plane have the same two less significant bits (00, 01, 11, or 10), and that the two more significant bits of the symbols present in the same quadrant and close to the same axis of the complex plane differ by a single bit from one symbol to another. In this way the symbols of the complex plane are segmented into subsets.

More precisely, this segmentation into subsets is obtained by means firstly of a subset-selection module 16 for selecting a subset, which module receives the encoded bits output by the encoders 13 and 14, secondly of a symbol-selection module 17 for selecting one symbol out of four in the selected subset, and thirdly of a mapping module 18 for allocating a given amplitude level to each of the various symbols so as to obtain a constellation such as the constellation shown in FIG. 2.

It should be noted that it is possible to use other types of mapping that comply with the above-mentioned two rules, in particular mapping consisting in inverting all of the logic states 1 and 0, which mapping supplies a constellation phase-shifted by 180° relative to the constellation shown in FIG. 2.

FIG. 3 shows the partitioning into subsets that is chosen for obtaining the constellation shown in FIG. 2. This partitioning takes place is module 16.

The symbol ∪ signifies the union of the various types of subsets Δ, o, Π, and Θ. The first partitioning level consists in splitting up the constellation into two sets, namely, in this example, the set of symbols belonging to the subsets Δ and Π, and the set of symbols belonging to the subsets o and Θ. The second partitioning level consists in splitting up each of the two sets into two subsets so as to obtain the four subsets Δ, Π, o, and Θ. The second partitioning level makes it possible to increase the Euclidean distance between the symbols belonging to the same subset.

It should be noted that the partitioning into subsets as implemented in the present invention differs from the partitioning proposed by Ungerboeck for TCM encoding in that, in the invention, the vertical distance (along axis Q) is increased by the first partitioning level, and the horizontal distance (along axis I) is increased by the second partitioning level, which is not the case in Ungerboeck partitioning.

It is possible to calculate the gain obtained by these two partitioning operations: the inter-symbol distances in each subset in the two first levels are: $\Delta_1^2=1$ and $\Delta_2^2=1$. Encoding is then performed by the two parity codes of Hamming distance 2, so as to increase $(d_{free})^2$ to 2 ($d_{free}$ is the free distance), using the "multi-level encoding lemma" relationship: $(d_{free})^2 = \min\{\Delta_i^2 D_H^i\}$, where $\Delta_i^2$ is the square of the Euclidean distance and $D_H^i$ is the Hamming distance of the code component at level i. This relationship characterizes multi-level encoding, and is applicable to the case of block-encoded modulation.

For a quick evaluation of the gain supplied by the invention, in this scheme, $(d_{free})^2=2$ and the effective coding rate (number of message information bits transmitted per information symbol) $R_{eff}$ is equal to 3.88 bits/symbol (the coding efficiency is equal to (4N−2)/4N, i.e. 0.97 for N=16). The non-encoded 16-QAM reference system has a rate of 4 bits/symbol and $(d_{free})^2=1$. The coding gain ΔG obtained is thus as follows:

$$\Delta G = 10 \cdot \log(R_{eff} d_{free}^2) - 10) \cdot \log(R_{eff} d_{free}^2)_{ref} = 2.8724 \text{ dB}$$

It should be noted that, with an coding rate of (4N−2)/4N, the product $R_{eff}^*(d_{free})^2$ is at its maximum because the parity code (N, N−1) has a Hamming distance equal to 2 which satisfies the Singleton limit with the equation D≤N−K+1. The $\Delta_i^2$ are set by the partitioning into subsets. In compliance with the above-mentioned "multi-level encoding lemma", given the relationship between the free distance of the overall scheme and the Hamming distances of the codes components, and given the square of the Euclidean distances of each partitioning level, the resulting free distance is maximal. Therefore, the scheme proposed in the present invention may be termed "optimal".

The total removal of phase ambiguities has been verified by simulation. This scheme has an encoding gain (expressed in Eb/No) of about 1 dB for a bit error rate (BER) of $10^{-3}$, of 1.5 dB for a BER of $10^{-4}$, and of 2 dB for a BER of $10^{-6}$.

Its transparency to phase ambiguities of ±π/2 and of π can be seen in FIG. 2:

a phase rotation of 180° implies: Δ↔o and Π↔Θ where ↔ indicates a swap;

a phase rotation of 90° implies: Δ→Π→o→Θ→Δ an a phase rotation of −90° implies: Δ←Π←o←Θ←Δ since the parity code (N, N−1) is transparent to interchanging 0↔1if its length N is even.

Since these four subsets are encoded using Gray mapping, two-dimensional differential encoding removes all three of these phase ambiguities. Since the subsets Π, o, and Θ are rotated relative to the subset Δ, a second differential encoding operation must be applied to the bits $I_2$ and $I_3$.

The coding rate is Rc=(4N−2)/4N, i.e. (4N−2/N) bits/symbol assuming that the two parity bits are added every 15.5 symbols for N=16. The higher the value of N, the larger the effective rate. The asymptotic encoding gain and the architecture of the encoder and of the decoder as described below remain unchanged regardless of the length N, where N is even.

As shown in FIG. 1, the amplitude levels I and Q are applied to quadrature modulation means 19 supplying a signal to be transmitted ST. The signal ST is transmitted, e.g. via a radio link, to a receiver such as the receiver shown in FIG. 4.

Figure 4:
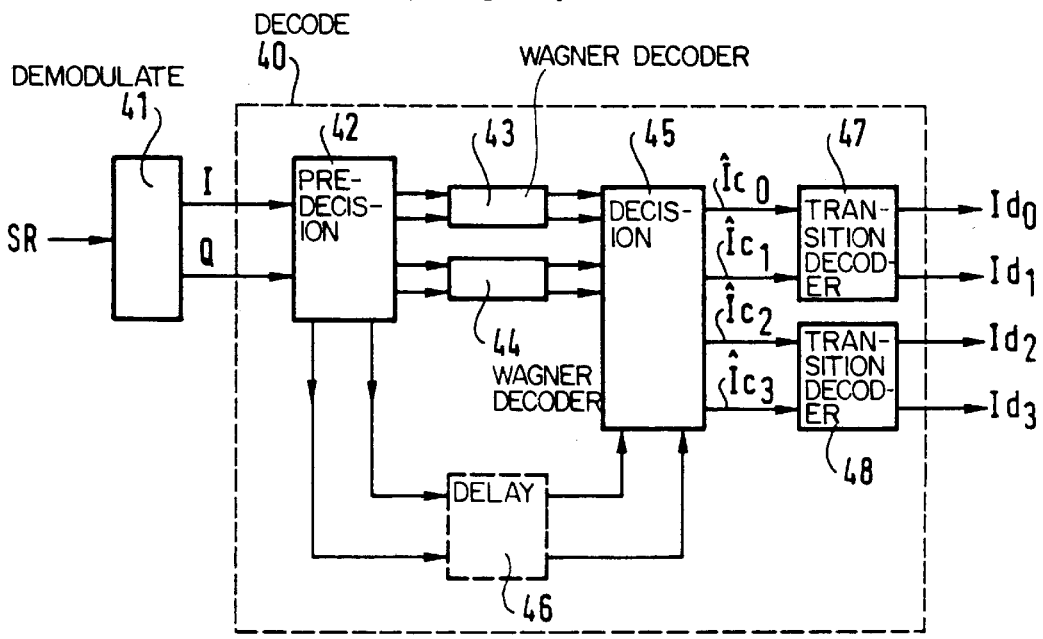
FIG. 4 is a block diagram of a signal receiver including decoding means of the invention.

FIG. 4 is a block diagram of a signal receiver including decoding means of the invention.

The receiver includes decoding means given overall reference 40. The decoding means 40 receive two base-band streams I and Q from quadrature demodulation means 41 for demodulating the received signal SR in quadrature, the base-band streams corresponding to two received amplitude levels. The quadrature demodulation means output four received and decoded bits $Id_0$ to $Id_3$ corresponding, in the absence of error, to the bits $I_0$ to $I_3$ shown in FIG. 1.

The decoding means 40 include a pre-decision unit 42 which in particular takes a firm decision on the received amplitude levels I and Q, i.e. it takes a decision, every symbol time, on the position of a symbol in the 16-QAM constellation as a function of the amplitude levels I and Q. This pre-decision takes place in particular on the basis of the received bits $I_0$ and $I_1$ to determine which of the above-defined subsets is the subset to which the received symbol belongs. For each of the received amplitude levels, the unit 42 also supplies a reliability coefficient and sector information.

A reliability coefficient is the difference in absolute terms between the square of the Euclidean distance between the received amplitude level (I or Q and generally referenced r) and the amplitude level corresponding to the closest ideal symbol in the 16-QAM constellation. The reliability coefficient makes it possible to know, at each symbol time, the reliability of the decision taken on the decided symbol, by taking into account the four bits that characterize said symbol.

Sector information makes it possible to define which one of the three sectors delimited by decision thresholds corresponding to expected ideal amplitude levels for the four symbols closest to the two axes of said 16-QAM constellation is the sector in which the received symbol lies.

Figure 5:
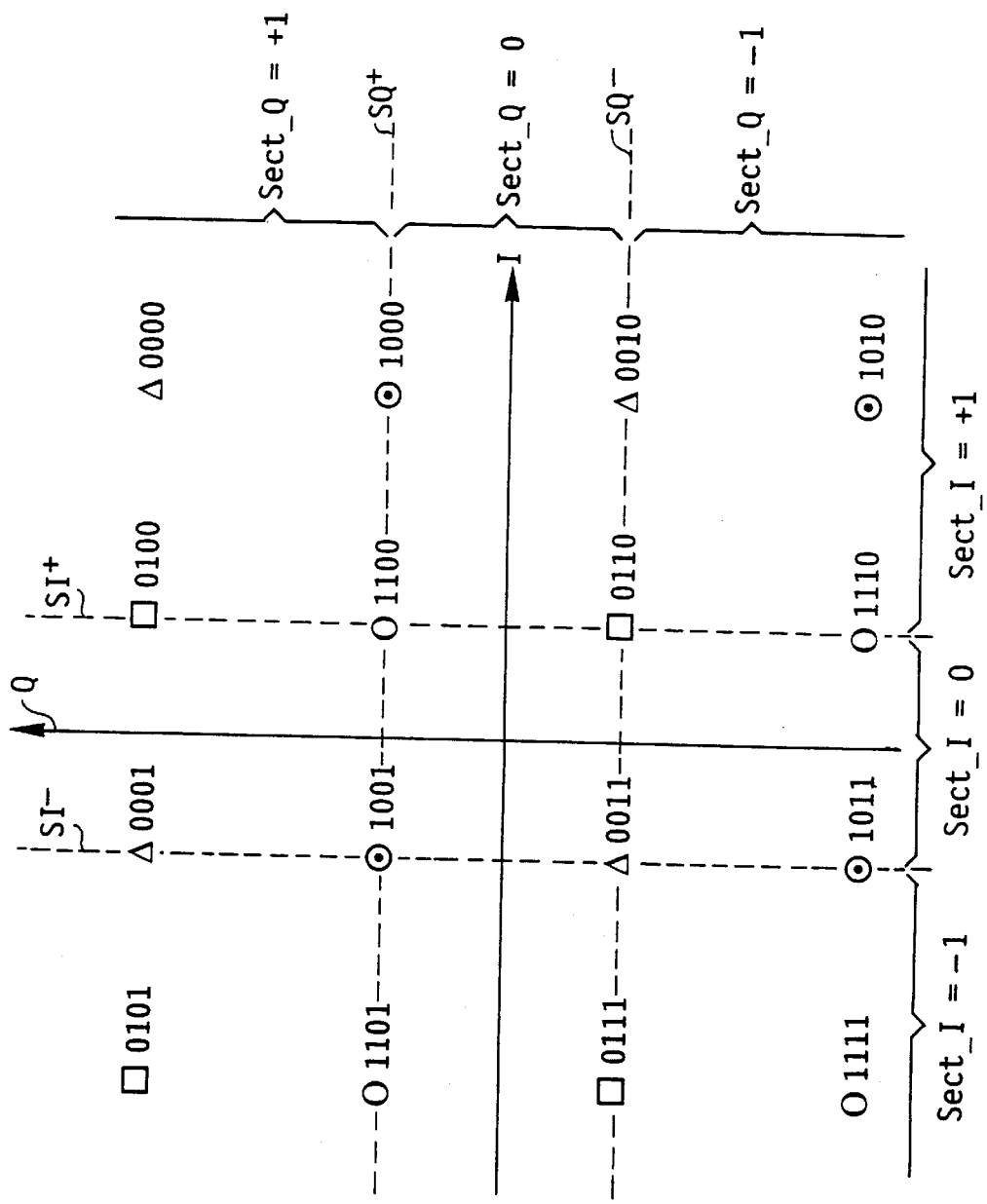
FIG. 5 shows decision levels and sector information as used for performing decoding in the context of the present invention.

These decision thresholds and the sector information are shown in FIG. 5.

The decision thresholds are, in this example, referenced $SI^-$ & $SI^+$ for axis I, and $SQ^-$ & $SQ^+$ for axis Q. By way of example, the threshold levels $SI^-$ and $SQ^-$ correspond to a standardized amplitude of −0.5, the threshold levels $SI^+$ and $SQ^+$ corresponding to a standardized amplitude of +0.5. In this case, the expected maximum amplitude levels are ideally ±1.5 on both axes. The sectors delimited as indicated above are referred to as Sect_I and Sect_Q. In this example, they are allocated the values 0, +1 or −1, and they split up the constellation into nine zones, each zone containing four points of the constellation.

The reliability is the difference in absolute terms in the squares of the Euclidean distances between the received signal, r, and the two closest points in the constellation. There are only three possibilities (a, b, and c), examined below for the received amplitude level received on channel I, where $f_i^I$ is the reliability coefficient and Sect_I is the corresponding sector:

a) if −0.5≤I<0.5, then $f_i^I=|I|$ and Sect_I=0
b) if I≥0.5, then $f_i^I=|I-1|$ and Sect_I=+1
c) if I≤−0.5, then $f_i^I=|I+1|=||I|-1|$ and Sect_I=−1

For channel Q, a reliability coefficient $f_i^Q$ is calculated in the same way, and the reliability coefficient $f_i^Q$ and the sector Sect_Q are thus obtained.

Any received point r necessarily lies in one of the 9 sectors, and it is decoded at one of the four points in the sector. The fact that channels I and Q are independent simplifies calculation of the reliability coefficients.

The above-mentioned firm decisions for the two more significant bits and the reliability coefficients are applied to two Wagner decoders 43, 44 operating under flexible decision conditions, and serving to participate in determining the optimal subset to which the received symbol belongs. More precisely, each Wagner decoder 43, 44 receives firstly the firm decisions on the more significant bits $I_0$ and $I_1$, referenced $\hat{I}_0$ and $\hat{I}_1$, and secondly a reliability coefficient. Each Wagner encoder operates for a respective one of the channels, I or Q, and supplies binary values estimated block-by-block, together with correction information.

A Wagner decoder operates as follows: if the bits $\hat{I}_0$ and $\hat{I}_1$ that it receives satisfy the parity relationship calculated at the parity encoders 13 and 14 shown in FIG. 1, it outputs correction information equal to 0, and referred to as "Wagner_corr_I" or as "Wagner_corr_Q" as a function of the axis that it is processing. In contrast, if the symbols $\hat{I}_0$ and $\hat{I}_1$ that it receives do not satisfy the parity relationship, it supplies opposite correction information, "Wagner_corr_I" or "Wagner_corr_Q", that is equal to 1.

The correction information is generated every N symbols because it is necessary to take into account the parity information inserted at the encoder (FIG. 1). If "Wagner_corr_I"=1, there is an error on axis I, and if "Wagner_corr_Q"=1, there is an error on axis Q.

The Wagner algorithm is a very simple decoding algorithm operating under flexible decision conditions and adapted to decoding codes containing parity bits.

The correction information, the decided bits $\hat{I}_0$ to $\hat{I}_3$, and said sector information are applied to a decision unit 45. The sector information coming from the pre-decision unit 42 may pass through an optional delay unit 46 shown in dashed lines. The decided bits $\hat{I}_2$ and $\hat{I}_3$ also pass through the delay unit 46 which applies a delay corresponding to the time taken by the Wagner decoders 43, 44 to process the signals that they receive.

The decision unit 45 has two de-mapping functions:
-i- it corrects the two decided more significant bits $\hat{I}_0$ and $\hat{I}_1$ as a function of the correction information; and
-ii- it corrects the two decided less significant bits $\hat{I}_2$ and $\hat{I}_3$ as a function of the sector information, of the two corrected more significant bits corrected in step-i-, and of the correction information.

Step -i- may likewise be performed in the Wagner decoders 43 and 44 instead of being performed in the decision unit 45.

The de-mapping algorithm is described below.

Considering firstly the two decided bits $\hat{I}_0$ and $\hat{I}_1$ (step -i-), the de-mapping is as follows:

if "Wagner_corr_Q"=1, a rotation ΔUΠ↔oUΘ has taken place,
so $\hat{I}c_0 = \hat{I}_0 \oplus 1$
where $\oplus$ is the exclusive-or operator, and $\hat{I}c_0$ is the value of the corrected more significant bit;
if "Wagner_corr_I"=1, either a rotation Δ↔Π, or a rotation o↔Θ has taken place,
so $\hat{I}c_1 = \hat{I}_1 \oplus 1$
where $\hat{I}c_1$ is the value of the second corrected more significant bit; and
if "Wagner_corr_Q"=1, and "Wagner_corr I"=1, either a rotation Δ↔Θ, or a rotation o↔Π has taken place,
so $\hat{I}c_0 = \hat{I}_0 \oplus 1$ and $\hat{I}c_1 = \hat{I}_1 \oplus 1$ In general, as in the known use of the Wagner algorithm, the value of the least reliable bit is changed when a parity error is detected. Such parity error detection is positive when an odd number of errors have occurred during transmission because of noise.

For de-mapping the less significant bits $\hat{I}_2$ and $\hat{I}_3$ (step -ii-), the message information is (Sect_I, Sect_Q), ($\hat{I}c_0$ and $\hat{I}c_1$) and (Wagner_corr_I, Wagner_corr_Q). The error bits ($E_2, E_3$) are then calculated to correct the less significant bits $\hat{I}_2$ and $\hat{I}_3$ by making $(\hat{I}c_2, \hat{I}c_3) = (\hat{I}_2, \hat{I}_3) \oplus (E_2, E_3)$, where $\hat{I}c_2$ and $\hat{I}c_3$ are the values of the corrected less significant bits.

The corrections on $\hat{I}_2$ and $\hat{I}_3$ are summarized in the following three tables.

For table 1, "Wagner_corr_I"=1, and "Wagner_corr_Q"=0. The values of ($E_2, E_3$) corresponding to Sect_I and Sect_Q are then:

TABLE 1

| Sect_I, Sect_Q | $E_2, E_3$ |
|---|---|
| −1,−1 | 0, 0 |
| −1, 0 | 0, 0 |
| −1, 1 | 0, 0 |
| 0,−1 | 1, 0 |
| 0, 0 | 1, 0 |
| 0, 1 | 1, 0 |
| 1,−1 | 0, 0 |
| 1, 0 | 0, 0 |
| 1, 1 | 0, 0 |

For table 2, "Wagner_corr_I"=0, and "Wagner_corr_Q"=1. The values of ($E_2, E_3$) corresponding to Sect_I and Sect_Q are then:

TABLE 2

| Sect_I, Sect_Q | $E_2, E_3$ |
|---|---|
| −1,−1 | 0, 0 |
| −1, 0 | 0, 1 |
| −1, 1 | 0, 0 |
| 0,−1 | 0, 0 |
| 0, 0 | 0, 1 |
| 0, 1 | 0, 0 |
| 1,−1 | 0, 0 |
| 1, 0 | 0, 1 |
| 1, 1 | 0, 0 |

For table 3, "Wagner_corr_I"=1, and "Wagner_corr_Q"=1. The values of ($E_2, E_3$) corresponding to Sect_I and Sect_Q are then:

TABLE 3

| Sect_I, Sect_Q | $E_2, E_3$ |
|---|---|
| −1,−1 | 0, 0 |
| −1, 0 | 0, 1 |
| −1, 1 | 0, 0 |
| 0,−1 | 1, 0 |
| 0, 0 | 1, 1 |
| 0, 1 | 1, 0 |
| 1,−1 | 0, 0 |
| 1, 0 | 0, 1 |
| 1, 1 | 0, 0 |

By putting "0" for Sect_I=0 and "1" for Sect_I=0 or Sect_I=−1, and using similar referencing for Sect_Q, it can be observed that the corrections on $(\hat{I}c_2, \hat{I}c_3) = (\hat{I}_2, \hat{I}_3) \oplus (E_2, E_3)$ given by $E_2, E_3$ have become two simple Boolean functions:

$E_2 = (\text{Sect\_Q} \oplus 1) * \text{"Wagner\_corr\_Q"}$ $E_3 = (\text{Sect\_I} \oplus 1) * \text{"Wagner\_corr\_I"}$ It can also be noted that it is sufficient to reference the sector numbers by two bits (0 or 1) only for all nine sectors of the constellation:

if $-0.5 \leq I < 0.5$, then Sect_I=0, otherwise Sect_I=1; and
if $-0.5 \leq Q < 0.5$, then Sect_Q=0, otherwise Sect_Q=1

The corrected bits $\hat{Ic}_0$ to $\hat{Ic}_3$ output by the decision unit 45 are then applied to two transition decoders 47, 48, each of which has two dimensions, a first one of said decoders (47) receiving the two corrected more significant bits $\hat{Ic}_0$ and $\hat{Ic}_1$, the second one of said decoders (48) receiving the two corrected less significant bits $\hat{Ic}_2$ and $\hat{Ic}_3$. The decoders 47 and 48 supply received and decoded bits $\hat{Id}_0$ to $\hat{Id}_3$.

The equations of each differential encoder 47, 48 are, in the case of transition encoding, given above for transmission:

$$A_i = (\overline{a_i} \cdot \overline{b_i} \cdot b_{i-1}) + (a_i \cdot \overline{b_i} \cdot \overline{a_{i-1}}) + (a_i \cdot b_i \cdot \overline{b_{i-1}}) + (\overline{a_i} \cdot b_i \cdot a_{i-1})$$

$$B_i = (\overline{a_i} \cdot \overline{b_i} \cdot a_{i-1}) + (a_i \cdot \overline{b_i} \cdot b_{i-1}) + (a_i \cdot b_i \cdot \overline{a_{i-1}}) + (\overline{a_i} \cdot b_i \cdot \overline{b_{i-1}})$$

Transition encoding/decoding makes it possible to remove phase ambiguities of $\pm\pi/2$ and of $\pi$, and the scheme proposed is thus transparent to phase ambiguities.

The invention is particularly applicable to transmitting data in 16-QAM by radio links for a transmitted data-rate of about 10 Mbits per second. The transmitted data is integrated in frames, and it is thus possible to perform time division multiple access (TDMA) transmission. Since the number of parity bits added on encoding is fixed, the structure of the frames also has a fixed rate.

The added redundancy is very low and the encoding gain is thus maximal.

What is claimed is:

1. An encoding/decoding system using 16-QAM modulation encoded in multi-level blocks, said system including a transmitter for transmitting message information bits and a receiver for receiving message information bits;

said transmitter including:
two transition encoders, each of which has two dimensions, a first of said encoders receiving two message information bits to be transmitted referred to as more significant bits, the second of said encoders receiving two other message information bits to be transmitted referred to as less significant bits;
two parity encoders of rate N/N−1, where N is even, receiving the bits output from said first transition encoder, said parity encoders supplying, every N symbols, said bits output from said first transition encoder together with parity information;
an allocation unit for allocating a symbol from the complex plane of the 16-QAM constellation to each group of four bits output by said parity encoders and by said second transition encoders, said allocation unit supplying the respective amplitude levels of said symbols on respective transmission paths, while satisfying the following rules:
all of the symbols in the same quadrant of said complex plane have the same two less significant bits; and
the two more significant bits of the symbols in the same quadrant and close to the same axis of said complex plane differ from symbol to symbol by a single bit, the symbols in said complex plane being split up into subsets, each subset having a pair of more significant bits that is different from the pair of more significant bits of another subset; and
quadrature modulation means for modulating said amplitude levels in quadrature, and supplying a signal to be transmitted; and said receiver including:
quadrature demodulation means for demodulating the received signal in quadrature, and supplying two received amplitude levels;
a pre-decision unit which takes a firm decision on the received amplitude levels, and which, for each of said received amplitude levels, firstly calculates a reliability coefficient equal to the difference in absolute terms between the squared Euclidean distances of each received amplitude level and the amplitude level corresponding to the closest ideal symbol in the 16-QAM constellation, and secondly supplies sector information making it possible to define which one of the three sectors delimited by decision thresholds corresponding to expected ideal amplitude levels for the four symbols closest to the two axes of said 16-QAM constellation is the sector in which the received symbol lies;
two Wagner decoders taking flexible decisions, each of which decoders receiving firstly the firm decisions corresponding to said more significant bits and secondly one of said reliability coefficients, said Wagner decoders supplying, every N information symbols, said firm decisions together with correction information indicating that said parity information checks;
a decision unit receiving said firm decisions, said correction information and said sector information, said decision unit correcting the two more significant bits output by said Wagner decoders as a function of said correction information, and correcting the two decided less significant bits as a function of said sector information, of the corrected more significant bits, and of said correction information; and
two transition decoders, each of which has two dimensions, a first one of said decoders receiving the two corrected more significant bits, the second one of said decoders receiving the two corrected less significant bits, said decoders supplying received and decoded bits.

2. A system according to claim 1, wherein N is equal to 16.

* * * * *